(12) United States Patent
Kaiwa et al.

(10) Patent No.: US 8,018,246 B2
(45) Date of Patent: Sep. 13, 2011

(54) SEMICONDUCTOR DEVICE

(75) Inventors: Nakaba Kaiwa, Tokyo (JP); Yutaka Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/698,567

(22) Filed: Feb. 2, 2010

(65) Prior Publication Data

US 2010/0194204 A1     Aug. 5, 2010

(30) Foreign Application Priority Data

Feb. 4, 2009   (JP) ................................. 2009-023657

(51) Int. Cl.
*H03K 19/003* (2006.01)
*H03K 17/16* (2006.01)

(52) U.S. Cl. ............... 326/30; 327/378; 326/83; 326/27

(58) Field of Classification Search .................... 326/28, 326/30, 31, 34, 83, 86, 27, 29; 327/378, 327/170; 365/189.05
See application file for complete search history.

(56) References Cited

U.S. PATENT DOCUMENTS 7,164,287 B2 * 1/2007 Ueno .............................. 326/30
7,230,448 B2 * 6/2007 Choe .............................. 326/30

FOREIGN PATENT DOCUMENTS

JP     2008-048361     2/2008

\* cited by examiner

*Primary Examiner* — Daniel D Chang
(74) *Attorney, Agent, or Firm* — Young & Thompson

(57) ABSTRACT

A device includes a first circuit and an adjustment circuit. The adjustment circuit performs an adjustment on impedance of the first circuit. The adjustment circuit discontinues the adjustment on impedance while the first circuit is in an activated state.

20 Claims, 6 Drawing Sheets

SEMICONDUCTOR DEVICE

BACKGROUND OF THE INVENTION

1. Field of the Invention

The present invention generally relates to a semiconductor device. More specifically, the present invention relates to a semiconductor device such as DRAM (Dynamic Random Access Memory) which has a calibration circuit that adjusts impedance of an output buffer included in an output circuit.

Priority is claimed on Japanese Patent Application No. 2009-023657, filed Feb. 4, 2009, the content of which is incorporated herein by reference.

2. Description of the Related Art

In a semiconductor device such as a DRAM, in order to execute high-speed data transfer, it is necessary to achieve an impedance adjustment in a transfer system to suppress distortion in data transfer waveforms due to reflection.

Such an impedance adjustment is performed by adjusting the impedance of an output buffer circuit with a calibration circuit.

Japanese Unexamined Patent Application, First Publication, No. JP-A-2008-048361 discloses a technique of adjusting impedance of an output buffer in a calibration period which is 64 times the cycle of an external clock.

In general, a calibration circuit includes a calibration terminal (ZQ terminal) that is connected to a replica buffer circuit to which a plurality of transistors is connected in parallel and a comparator that compares a voltage appearing in the ZQ terminal with a reference voltage.

Then, an external resistor is connected to the ZQ terminal so as to determine a combination of transistors that goes well with the external resistor, and the result of combination (DQ driver code) is reflected in an output buffer forming an input/output circuit (DQ circuit), thus setting impedance of the output buffer to a predetermined value.

In order to determine the combination of the transistors forming the replica buffer circuit, a calibration period is required in which voltages are compared by a comparator or the constituent transistors are changed.

Since the calibration period depends on the cycle of the external clock, the calibration period may decrease when the frequency of the external clock increases. Therefore, it is difficult to perform the highly accurate impedance adjustment.

To solve this problem, a calibration method has been developed in which an oscillator circuit is operated not by the external clock but by an internal clock generated from the external clock, and a calibration circuit is operated by an output of the oscillator circuit.

On the other hand, in the method of performing calibration based on the output of the oscillator circuit, there may be a case that the calibration will not end within a predetermined period of time due to process variations, operation status, or the like.

Therefore, there was a problem in that when a READ or WRITE command is input from an external semiconductor device, for example a memory controller, during the calibration period, a change in DQ driver code may occur through the whole of a period of time when the input/output circuit is activated, whereby noise may be generated in an input and output signal of the input/output circuit.

SUMMARY

In one embodiment, a device may include, but is not limited to, a first circuit; and an adjustment circuit. The adjustment circuit performs an adjustment on a first impedance of the first circuit. The adjustment circuit discontinues the adjustment on the first impedance while the first circuit is in an activated state.

In another embodiment, the device may include, but is not limited to, an adjustment circuit that changes a driver size of a first circuit and a control circuit that inhibits the adjustment circuit from changing the driver size of the first circuit, in response to an input of a command signal to activate the first circuit.

In still another embodiment, a method may include, but is not limited to, allowing an adjustment on an impedance of a circuit while the circuit is in a deactivated state; and inhibiting the adjustment on the impedance of the first circuit while the circuit is in an activated state. Allowing the adjustment may include, but is not limited to, supplying a driver code which is to change the impedance of the circuit. Inhibiting the adjustment may include, but is not limited to, holding the driver code until the circuit is transitioned from the activated state to the deactivated state.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
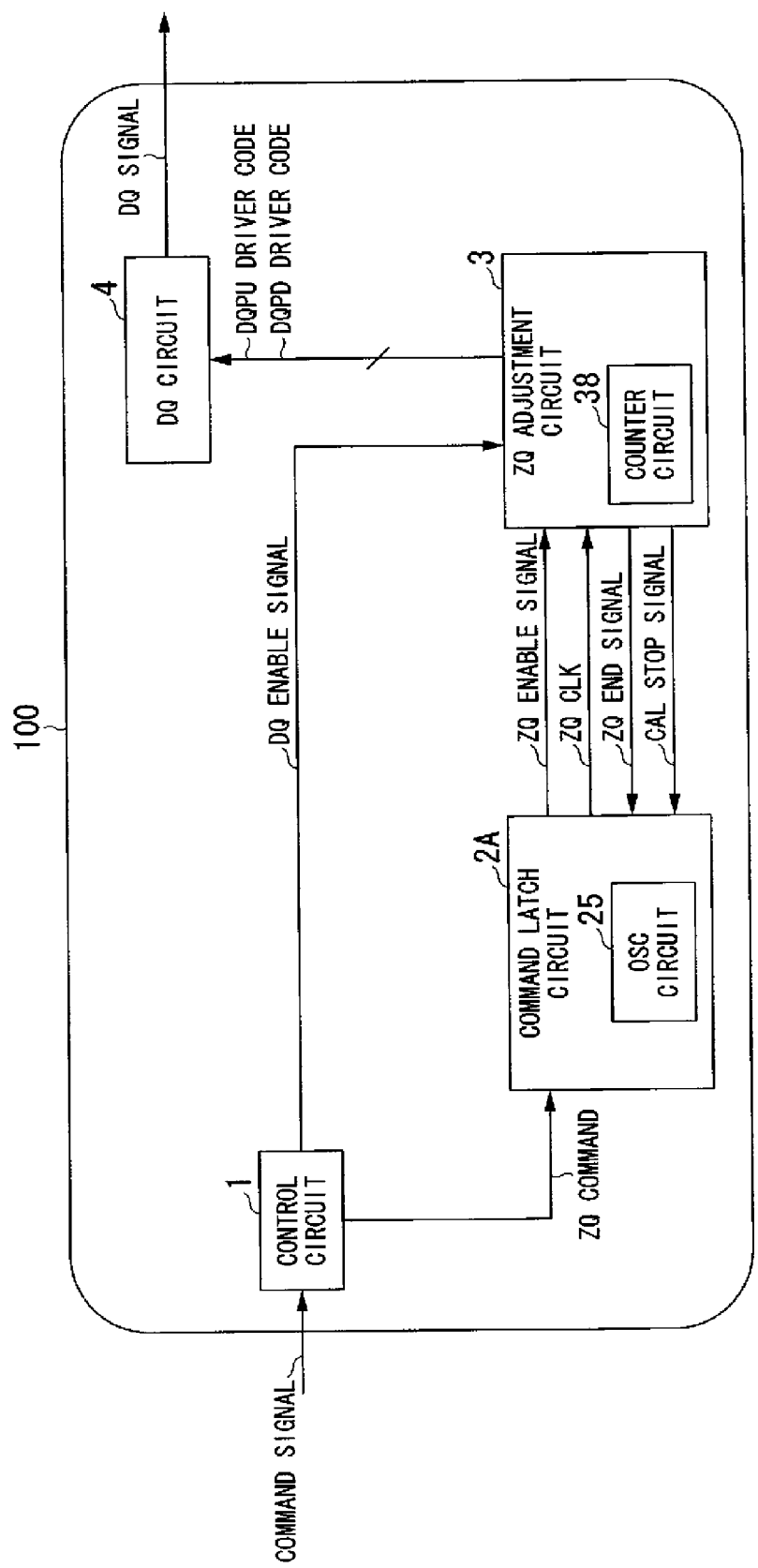
FIG. 1 is a block diagram of a semiconductor device according to a first embodiment of the invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a device may include, but is not limited to, a first circuit; and an adjustment circuit. The adjustment circuit performs an adjustment on a first impedance of the first circuit. The adjustment circuit discontinues the adjustment on the first impedance while the first circuit is in an activated state.

In some cases, the device may further include, but is not limited to, a control circuit that inhibits the adjustment circuit from performing the adjustment on the first impedance, in response to an input of a command signal. The command signal is to activate the first circuit.

In some cases, the adjustment circuit can generate a driver code for adjustment on the first impedance, the adjustment circuit supplies the driver code to the first circuit.

In some cases, the adjustment circuit may hold the driver code while the first circuit is in the activated state. The adjustment circuit may supply the driver code to the first circuit after the first circuit is transitioned to a deactivated state from the activated state.

In some cases, the first circuit may include, but is not limited to, an input/output circuit and the first impedance is an impedance of the input/output circuit.

In some cases, the adjustment circuit may discontinue the adjustment on the first impedance while the first circuit is activated in accordance with at least one of a read command and a write command.

In some cases, the device may include, but is not limited to, an impedance-adjustment control signal generating circuit that generates an impedance-adjustment control signal. The impedance-adjustment control signal inhibits the adjustment circuit from performing the adjustment on the first impedance.

In some cases, the adjustment circuit may include, but is not limited to, a control circuit that initiates the adjustment on the first impedance in response to the impedance-adjustment control signal; a driver code generating circuit that generates a driver code; and a replica circuit that replicates the first circuit. The driver code generating circuit changes a second impedance of the replica circuit to have the second impedance close to a predetermined impedance value. The driver code generating circuit generates the driver code, based on a configuration of the replica circuit, when the second impedance comes close to the predetermined impedance value. The driver code generating circuit supplies the driver code to the first circuit after the first circuit is transitioned to a deactivated state from the activated state.

In some cases, the driver code generating circuit generates a driver code generation terminating signal when the second impedance comes close to the predetermined impedance value.

In some cases, the driver code generating circuit generates a driver code generation terminating signal after the first circuit is transitioned to a deactivated state from the activated state.

In some cases, the impedance-adjustment control signal generating circuit generates a first clock signal. The driver code generating circuit generates the driver code in synchronism with the first clock signal.

In some cases, the first circuit may include, but is not limited to, a first plurality of transistors. The replica circuit may include a second plurality of transistors which is identical to the first plurality of transistors. The driver code generating circuit generates the driver code based on ON-OFF states of the second plurality of transistors.

In some cases, the control circuit may include, but is not limited to, a counter that counts up the first clock signal. The control circuit generates the driver code generation terminating signal when the number counted by the counter reaches a predetermined number.

In some cases, the impedance-adjustment control signal generating circuit transitions the impedance-adjustment control signal from a first logic level to a second logic level in response to a calibration command. The impedance-adjustment control signal generating circuit transitions the impedance-adjustment control signal from the second logic level to the first logic level in response to a driver code generation terminating signal that is generated by the driver code generating circuit.

In some cases, the impedance-adjustment control signal generating circuit may include an oscillator circuit that generates a first clock in response to a transition of the impedance-adjustment control signal from the first logic level to the second logic level. The driver code generating circuit generates the driver code in synchronism with the first clock signal.

In some cases, the impedance-adjustment control signal generating circuit generates a first clock, in response to an external signal which is cyclically input, after the impedance-adjustment control signal is transitioned from the first logic level to the second logic level. The driver code generating circuit generates the driver code in synchronism with the first clock signal.

In another embodiment, the device may include, but is not limited to, an adjustment circuit that changes a driver size of a first circuit and a control circuit that inhibits the adjustment circuit from changing the driver size of the first circuit, in response to an input of a command signal to activate the first circuit.

In some cases, the adjustment circuit may generate a driver code which is to change the driver size of the first circuit. The adjustment circuit holds the driver code while the first circuit is in the activated state. The adjustment circuit supplies the driver code to the first circuit after the first circuit is transitioned to a deactivated state from the activated state.

In still another embodiment, a method may include, but is not limited to, allowing an adjustment on an impedance of a circuit while the circuit is in a deactivated state; and inhibiting the adjustment on the impedance of the first circuit while the circuit is in an activated state. Allowing the adjustment may include, but is not limited to, supplying a driver code which is to change the impedance of the circuit. Inhibiting the adjustment may include, but is not limited to, holding the driver code until the circuit is transitioned from the activated state to the deactivated state.

FIRST EMBODIMENT

FIG. 1 is a block diagram of a semiconductor device 100 according to an embodiment of the invention.

In FIG. 1, the semiconductor device 100 includes a control circuit 1, a command latch circuit 2A, a ZQ calibration circuit 3, and a DQ circuit 4.

In this embodiment, the semiconductor device 100 performs an impedance adjustment (ZQ calibration) between an external resistor element ER connected to a ZQ terminal and an internal replica buffer upon receiving a calibration command. The DQ circuit 4 receives and reflects therein this calibration result (DQ driver code) and changes the size of a driver of an output buffer. The control circuit 1 generates a signal (DQ Enable signal) indicating that an input/output circuit (the DQ circuit 4) is activated, upon receiving a READ or WRITE command. The ZQ calibration circuit 3 holds the DQ driver code in a latch circuit during an activation period of the input/output circuit (the DQ circuit 4). The ZQ calibration circuit 3 supplies the DQ driver code to the input/output circuit after the lapse of the activation period. This configuration will be described in detail below.

The control circuit 1 is a circuit which receives a command signal from the outside of the semiconductor device 100 and performs a desired operation on the semiconductor device 100 in response to the input command.

Although not shown in FIG. 1, in the case of DRAMs, for example, the input command may be instructions determined by a combination of the logic levels of the signals CSB (Chip Select Bar), RASB (Row Address Strobe Bar), CASB (Column Address Strobe Bar), and WEB (Write Enable Bar) which are input to the terminals of the semiconductor device 100.

Examples of the input command includes READ and WRITE commands for instructing operations of reading and writing data stored in a memory cell not shown in FIG. 1 between the memory cell and the DQ circuit 4.

Upon receiving the READ or WRITE command, the control circuit 1 outputs a DQ Enable signal to the ZQ calibration circuit 3.

A calibration command is also input to the semiconductor device 100 in response to the command input. Upon receiving the calibration command, the control circuit 1 outputs a ZQ command to the command latch circuit 2A.

The command latch circuit 2A is a circuit that generates and outputs a ZQ Enable signal and ZQCLK to the ZQ calibration circuit 3 based on the logic level of the ZQ command input from the control circuit 1. The ZQ Enable signal is an impedance-adjustment control signal which initiates and terminates the impedance adjustment.

The ZQ calibration circuit 3 is a circuit that performs an impedance adjustment (ZQ calibration) between an external resistor element connected to a ZQ terminal and an internal replica buffer in synchronism with the input ZQCLK upon receiving the ZQ Enable signal. The ZQ calibration circuit 3 supplies this calibration result to the DQ circuit 4 as a DQPU driver code and a DQPD driver code. The ZQ calibration circuit 3 performs an adjustment of an output impedance of the DQ circuit 4.

The ZQ calibration circuit 3 does not output the DQ driver code (the DQPU driver code and the DQPD driver code) to the DQ circuit 4 when the DQ Enable signal is input thereto, details of which will be described later.

When an internal counter circuit 38 has counted a predetermined number of counts of the ZQCLK, the ZQ calibration circuit 3 receives a ZQ calibration stop command and supplies a ZQ End signal and a CAL stop signal to the command latch circuit 2A. The ZQ End signal is a driver-code-generation terminating signal that terminates the generation of the driver code.

The DQ circuit 4 is a circuit that inputs and outputs data between a memory cell not shown in FIG. 1 and input and output pins.

The DQ circuit 4 changes the size of a driver of an output buffer as described later and adjusts an output impedance in accordance with the DQPU driver code and the DQPD driver code input from the ZQ calibration circuit 3. In response to a READ command, the DQ circuit 4 outputs data from the memory cell to the input and output pins in a state where the output impedance is adjusted. In response to a WRITE command, the DQ circuit 4 supplies data from the outside of the semiconductor device 100 to the memory cell via an input circuit now shown.

Figure 2:
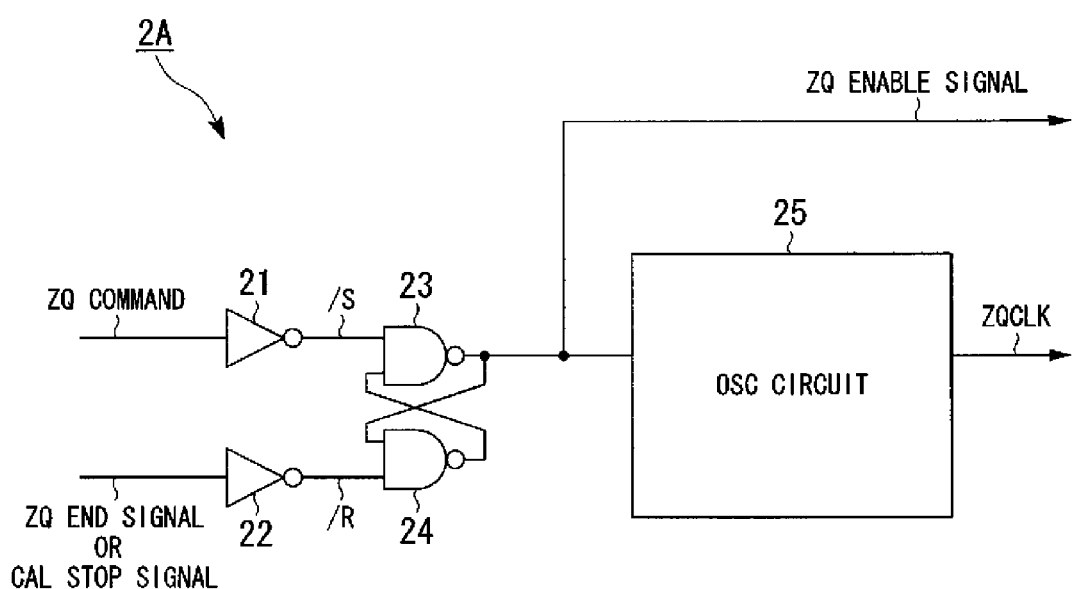
FIG. 2 is a block diagram of a command latch circuit of the semiconductor device shown in FIG. 1.

FIG. 2 is a block diagram of the command latch circuit 2A of the semiconductor device 100 shown in FIG. 1. In FIG. 2, the command latch circuit 2A includes inverter circuits 21 and 22, NAND circuits 23 and 24, and an OSC circuit 25.

The inverter circuit 21 is a circuit which receives a ZQ command and outputs an inverted logic signal thereof /S (Set Bar).

The inverter circuit 22 is a circuit which receives a ZQ End signal or a CAL stop signal and outputs an inverted logic signal thereof /R (Reset Bar).

Which one of the ZQ End signal and the CAL end signal will be input to the inverter circuit 22 is determined by a test mode signal, for example, which is generated by a mode select circuit not shown in FIG. 2. The mode select circuit is a circuit which receives a mode select signal from the outside of the semiconductor device 100 and generates a test mode signal. In the case of DRAMs, for example, the mode select circuit is a circuit that generates a test mode signal by a combination of the logic level of the input command described above and the logic level of an address input from an external address terminal not shown in FIG. 1.

The NAND circuit 23 is a negative logic AND circuit which receives the /S and an output of the NAND circuit 24 and outputs a ZQ Enable signal.

The NAND circuit 24 is a negative logical AND circuit which receives the ZQ Enable signal and the /R and has an output terminal thereof connected to an input of the NAND circuit 23.

The NAND circuits 23 and 24 forms a RS (Reset Set) flip-flop. That is, in FIG. 2, when the logic level of the /S input is changed from 1 to 0, the logic level of the ZQ Enable signal, which is the output, is changed from 0 to 1.

On the other hand, when the logic level of the /R input is changed from 1 to 0 in a state where the logic level of the ZQ Enable signal is 1, the logic level of the ZQ Enable signal, which is the output, is changed from 1 to 0.

As the OSC circuit 25 (oscillator circuit), a ring oscillator circuit is used, for example.

A ring oscillator circuit is a circuit which is composed of an odd number of inverter circuits whose output terminals are connected in chains to an input terminal of another inverter with an output terminal of the last-stage inverter connected to an input terminal of the first-stage inverter, thus forming a generally ring structure.

Since each of the inverter circuits has a finite delay, the last-stage inverter outputs the logical NOT of the first-stage input a finite delay after the first-stage input is asserted, and this last-stage output is input again to the first-stage inverter. The ring oscillator circuit is a circuit that oscillates by repeating this process.

The command latch circuit 2A shown in FIG. 2 outputs a ZQ Enable signal upon receiving a ZQ command and stops outputting the ZQ Enable signal upon receiving a ZQ End signal or a CAL stop signal.

The oscillator circuit oscillates upon receiving a ZQ Enable signal and periodically generates ZQCLK and supplies ZQCLK to the ZQ calibration circuit 3.

Figure 3:
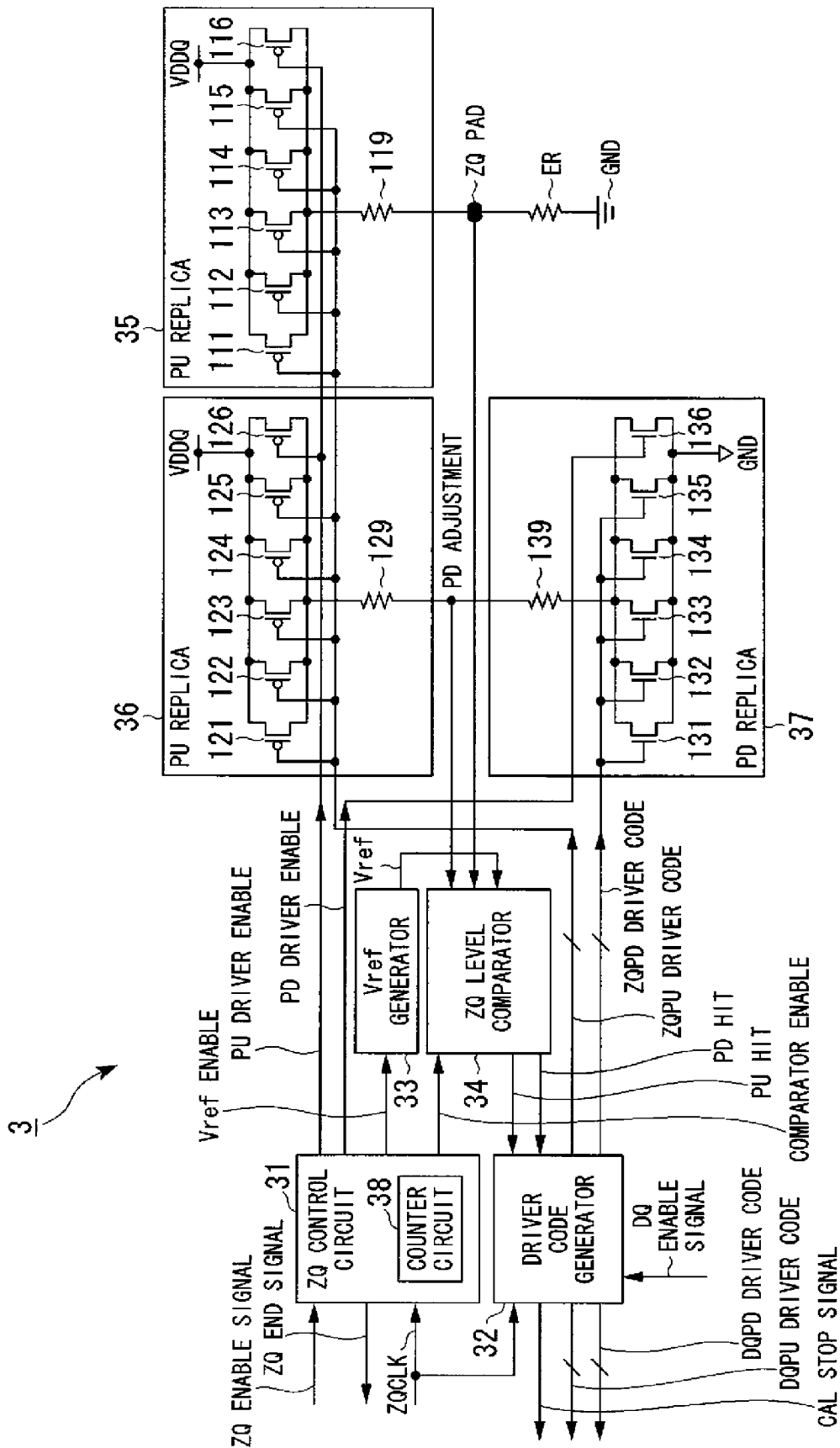
FIG. 3 is a block diagram of a ZQ calibration circuit of the semiconductor device shown in FIG. 1.

FIG. 3 is a block diagram of the ZQ calibration circuit 3 of the semiconductor device 100 shown in FIG. 1.

In FIG. 3, the ZQ calibration circuit 3 includes a ZQ control circuit 31, a driver code generation circuit 32, a Vref generator 33, a ZQ level comparator 34, PU replicas 35 and 36, and a PD replica 37. The ZQ calibration circuit 3 performs an impedance adjustment (ZQ calibration) between an external resistor element ER connected to the ZQ terminal and an internal replica buffer. The ZQ calibration circuit 3 supplies this calibration results to the DQ circuit 4 as the DQ driver code (the DQPU driver code and the DQPD driver code) after the lapse of an activation period of the input/output circuit (the DQ circuit 4). The DQ circuit 4 performs an impedance adjustment of the output buffer in accordance with the DQ driver code.

The ZQ control circuit 31 is a circuit which outputs Vref Enable to the Vref generator 33, Comparator Enable to the ZQ level comparator 34, PU Driver Enable to the PU replicas 35 and 36, and PD Driver Enable to the PD replica 37, respectively, upon receiving the ZQ Enable signal. In addition, the ZQ control circuit 31 performs control so as to start an adjustment (ZQ calibration) wherein a resistance of the external resistor element ER connected to the ZQ pad is made to be closer to an on-resistance of each replica.

The ZQ control circuit 31 is provided with the counter circuit 38. The ZQ control circuit 31 supplies the ZQ End signal to the command latch circuit 2A when the number of counts of the ZQCLK counted by the counter circuit 38 reaches a predetermined number of counts which is set in the counter. The number of counts being set is a number determined by the number of updates of the ZQ driver code which the driver code generation circuit 32 (described later) supplies to a replica circuit. For example, when the replica buffer is controlled on/off by 5 transistors during the impedance adjustment, the number of counts is set to 32 which is the fifth power of 2. The counter circuit 38 outputs the ZQ End signal to the command latch circuit 2A when the number of counts of the ZQCLK reaches 32.

The driver code generation circuit 32 is a circuit which outputs the ZQPU driver code and the ZQPD driver code to the PU replicas 35 and 36 and the PD replica 37 in synchronism with a rising edge of the ZQCLK, for example, which is input in time-series, and in response to the ZQCLK, and changes the output impedance of the replica circuit.

The driver code generation circuit 32 outputs a CAL stop signal, which is a ZQ calibration end signal, to the command latch circuit 2A when the impedance adjustment of the PU replica 36 and the PD replica 37 ends, namely when both PU and PD Hit signals are input from the ZQ level comparator 34. Furthermore, the driver code generation circuit 32 outputs the DQPU driver code and the DQPD driver code to the DQ circuit 4 based on the logic level of the DQ Enable signal.

The Vref generator 33 is a circuit which outputs a reference voltage Vref to the ZQ level comparator 34 upon receiving Vref Enable from the ZQ control circuit 31.

The potential of the reference voltage Vref is an intermediate voltage between the potential of the power source terminal VDDQ connected to the PU replicas 35 and 36 and a ground potential connected to the PD replica 37.

The ZQ level comparator 34 is a circuit which receives the reference voltage Vref described above and compares this potential with the potential of the ZQ pad or the potential of a PD calibration node.

The ZQ level comparator 34 outputs both the PU Hit and the PD Hit sequentially to the driver code generation circuit 32 when the potential of the reference voltage Vref becomes closer to the potential of the PD calibration node.

The PU replica 35 includes six P-channel MOS transistors 111 to 116 which are connected in parallel to the power source voltage VDDQ and a resistor element 119, one end of which is connected to the drains of these transistors.

These elements have the same configuration as that of pull-up circuits that constitute the output buffer of the DQ circuit 4.

The other end of the resistor element 119 is connected to the ZQ pad which is a calibration terminal.

Although the number of P-channel MOS transistors that constitute the PU replica 35 is 6, the number is not limited to this number but may be any other number.

The gate terminals of the P-channel MOS transistors 111 to 115 are input with the ZQPU driver code from the driver code generation circuit 32, and the gate terminal of the P-channel MOS transistor 116 is input with the PU Driver Enable from the ZQ control circuit 31. The ZQPU driver code collectively denotes five signals, and the P-channel MOS transistors 111 to 115 are individually controlled on/off by these signals.

To adjust the impedance closely over a wide range, W/L ratios (ratios of gate width to gate length) of the plurality of transistors forming the parallel circuit are preferably different from one another. For example, when the W/L ratio of the P-channel MOS transistor 116 is "1", the W/L ratios of the P-channel MOS transistors 111 to 115 may be set to "2", "4", "8", "16", and "32" respectively.

Appropriate selection of the P-channel MOS transistors 111 to 115 to be turned on by the ZQPU driver code allows that the on-resistance of the parallel circuit and the on-resistance of the PU replica 35 formed by the resistor element 119 can become closer to the resistance of the external resistor element ER connected to the ZQ pad, regardless of variations in the manufacturing conditions and the temperature changes.

The resistor element 119 is designed with a resistance of 120Ω, for example, and the external resistor element ER has a resistance of 240Ω. In this case, the logic level of the ZQPU driver code is determined so that the parallel circuit formed by the P-channel MOS transistors 111 to 116 has an on-resistance of 120Ω in the ON state.

The PU replica 36 has the same circuit configuration as the PU replica 35 except that the other end of a resistor element 129 is connected to the PD calibration node.

The L and W of P-channel MOS transistors 121 to 126 are the same as the L and W of the P-channel MOS transistors 111 to 116, respectively. The resistance of the resistor element 129 is the same as the resistance of the resistor element 119.

The gate terminals of the six P-channel MOS transistors 121 to 126 included in the PU replica 36 are input with the ZQPU driver code and the PU Driver Enable similarly to the PU replica 35.

Therefore, the result of the impedance adjustment of the PU replica 35 is reflected in the PU replica 36 and is used in the impedance adjustment of the PD replica 37.

The PD replica 37 includes six N-channel MOS transistors 131 to 136 which are connected in parallel to the ground voltage GND and a resistor element 139, one end of which is connected to the drains of these transistors. The other end of the resistor element 139 is connected to the PD calibration node.

These elements have the same configuration as that of pull-down circuits that constitute the output buffer of the DQ circuit 4.

The gate terminals of the N-channel MOS transistors 131 to 135 are input with the ZQPD driver code from the driver code generation circuit 32. The gate terminal of the N-channel MOS transistor 136 is input with the PD Driver Enable from the ZQ control circuit 31. The ZQPD driver code collectively denotes five signals, and the N-channel MOS transistors 131 to 135 are individually controlled on/off by these signals.

Therefore, by selecting appropriately the N-channel MOS transistors 131 to 135 to be turned on by the ZQPD driver code, the on-resistance of the PD replica 37 can be made to be closer to the on-resistance of the PU replica 36.

Since the on-resistance of the PU replica 36 is close to the on-resistance of the PU replica 35, it is possible to make the on-resistance of the PD replica 37 to be closer to the resistance of the external resistor element ER.

In the ZQ calibration circuit 3 shown in FIG. 3, the ZQ control circuit 31 starts the ZQ calibration when the logic level of the ZQ Enable signal changes from 0 to 1.

Specifically, the ZQ control circuit 31 outputs Vref Enable to the Vref generator 33. The ZQ control circuit 31 outputs Comparator Enable to the ZQ level comparator 34.

The ZQ level comparator 34 compares the potential of the reference voltage Vref with the potential of the ZQ pad. The ZQ level comparator 34 determines the logic level of the ZQPU driver code to be input to the PU replica 35. The ZQ level comparator 34 supplies PU Hit to the driver code generation circuit 32.

The ZQ level comparator 34 compares the potential of the reference voltage Vref with the potential of the PD calibration node. The ZQ level comparator 34 determines the logic level of the ZQPD driver code to be input to the PD replica 37. The ZQ level comparator 34 supplies PD Hit to the driver code generation circuit 32.

The ZQ control circuit 31 is provided with the counter circuit 38. The ZQ control circuit 31 supplies the ZQ End signal to the command latch circuit 2A when the number of counts of the ZQCLK counted by the counter circuit 38 reaches a predetermined number of counts.

The driver code generation circuit 32 updates the PU driver code in response to the ZQCLK during a time period before the PU Hit is input thereto. The driver code generation circuit 32 updates the PD driver code in response to the ZQCLK during a time period before the PD Hit is input thereto.

The driver code generation circuit 32 outputs the CAL Stop signal to the command latch circuit 2A when the adjustment ends (when both the PU Hit and the PD Hit are input thereto). Furthermore, the driver code generation circuit 32 outputs the DQPU driver code and the DQPD driver code to the DQ circuit 4 based on the logic level of the DQ Enable signal input thereto.

Figure 4A:
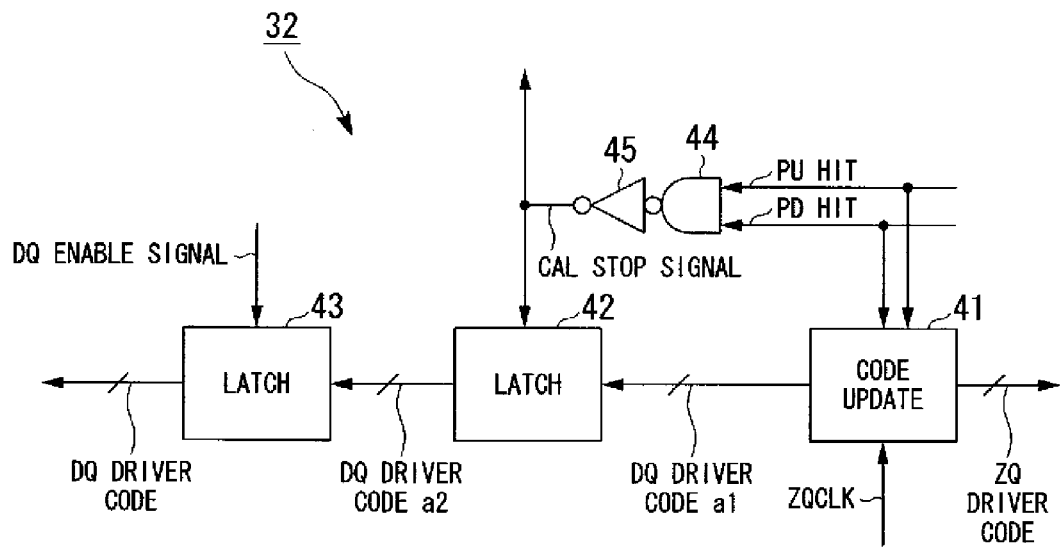
FIG. 4A is a block diagram of an example of the configuration of a driver code generation circuit shown in FIG. 3.

FIG. 4A is a block diagram of the driver code generation circuit 32 shown in FIG. 3. In FIG. 4A, the driver code generation circuit 32 includes a code update circuit 41, latch circuits 42 and 43, a NAND circuit 44, and an inverter circuit 45.

The code update circuit 41 is a circuit which changes the above-described ZQPU driver code, namely the logic levels of the five signals input to the gate terminals of the P-channel MOS transistors 111 to 115, specifically the logic levels of 5-bit data.

Figure 4B:
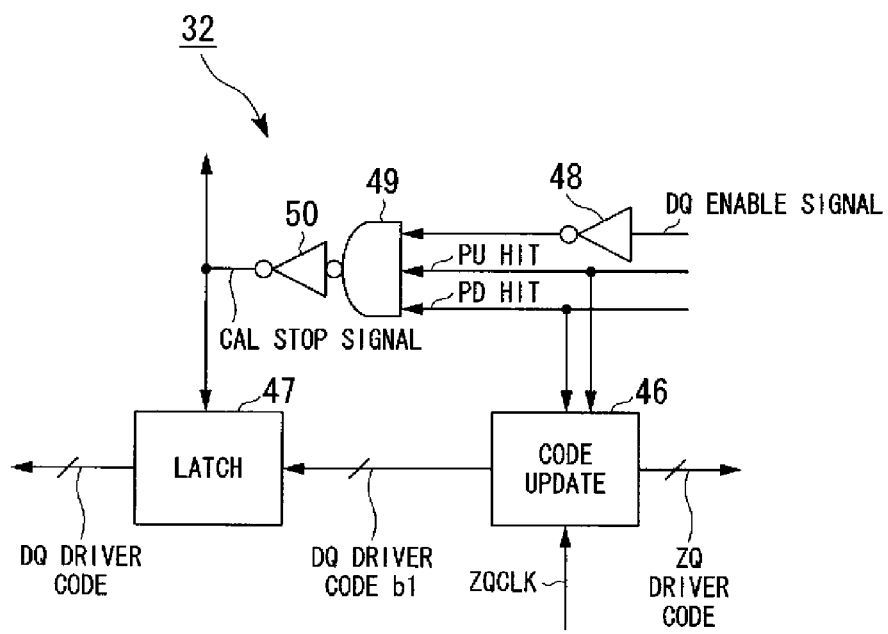
FIG. 4B is a block diagram of another example of the configuration of a driver code generation circuit shown in FIG. 3.

The code update circuit 41 also changes the ZQPD driver code, namely the logic levels of the five signals input to the gate terminals of the N-channel MOS transistors 131 to 135, specifically the logic levels of 5-bit data. In FIGS. 4A and 4B, the ZQPU driver code and the ZQPD driver code described above are collectively referred to as ZQ driver code.

The code update circuit 41 outputs a DQ driver code a1 to the latch circuit 42 upon receiving both the PU Hit and the PD Hit from the ZQ level comparator 34.

The NAND circuit 44 is a negative logic AND circuit which outputs a signal with logic level 1 to the inverter circuit 45 when the logic levels of the PU Hit and the PD Hit are all 1.

The inverter circuit 45 is a NOT circuit which inverts the logic level of an output of the NAND circuit 44. That is, the NAND circuit 44 and the inverter circuit 45 cooperate with each other to output the CAL Stop signal with logic level 1 to the command latch circuit 2A and the latch circuit 42 upon receiving both the PU Hit and the PD Hit signals from the ZQ level comparator 34.

The latch circuit 42 is a circuit which latches the DQ driver code a1. The latch circuit 42 supplies a DQ driver code a2 to the latch circuit 43 when the logic level of the CAL Stop signal becomes 1.

The latch circuit 43 is a circuit which latches the DQ driver code a2. The latch circuit 43 latches the DQ driver code a1 during a time period when the logic level of the DQ Enable signal is 1. The latch circuit 43 supplies the DQ driver code to the DQ circuit 4 when the logic level of the DQ Enable signal becomes 0.

The DQ driver code, the DQ driver code a2, and the DQ driver code a1 have the same logic level as that of the ZQ driver code and are 10-bit data which reflect the result of the impedance adjustment of the replica circuit of the ZQ calibration circuit 3.

Referring back to FIG. 1, the operation of the semiconductor device 100 will be described with reference to FIG. 5B. FIG. 5B is a timing chart showing operations of major signals in the semiconductor device 100 shown in FIG. 1, showing a state where the logic levels of the major signals change between 0 and 1 with the lapse of time. In FIG. 5B, the ZQ driver code is 10-bit that the code update circuit 41 or 46 outputs to the replica circuit in the ZQ calibration circuit 3. In the figure, "INVALID CODE" is data which are output during the impedance adjustment of the replica circuit, and represents data which are output after the "VALID CODE" is generated, namely after the PU Hit and the PD Hit are output.

The control circuit 1 changes the logic level of the ZQ command from 0 to 1 in response to an external command signal, and the command latch circuit 2A changes the logic level of the ZQ Enable signal from 0 to 1 by changing the logic level of the /S input of the NAND circuit 23 from 1 to 0 with the inverter circuit 21.

In this way, the OSC circuit 25 starts oscillating and generates the ZQCLK periodically as shown in FIG. 5B.

Figure 5A:
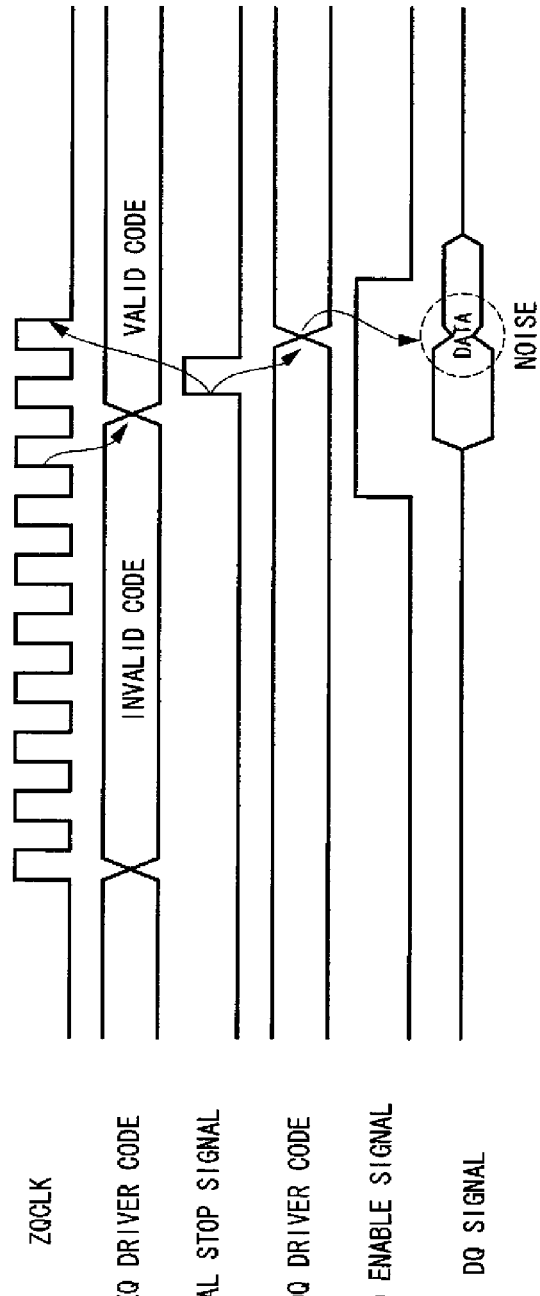
FIG. 5A is a timing chart illustrating an example of waveforms of signals of the semiconductor device shown in FIG. 1.
Figure 5B:
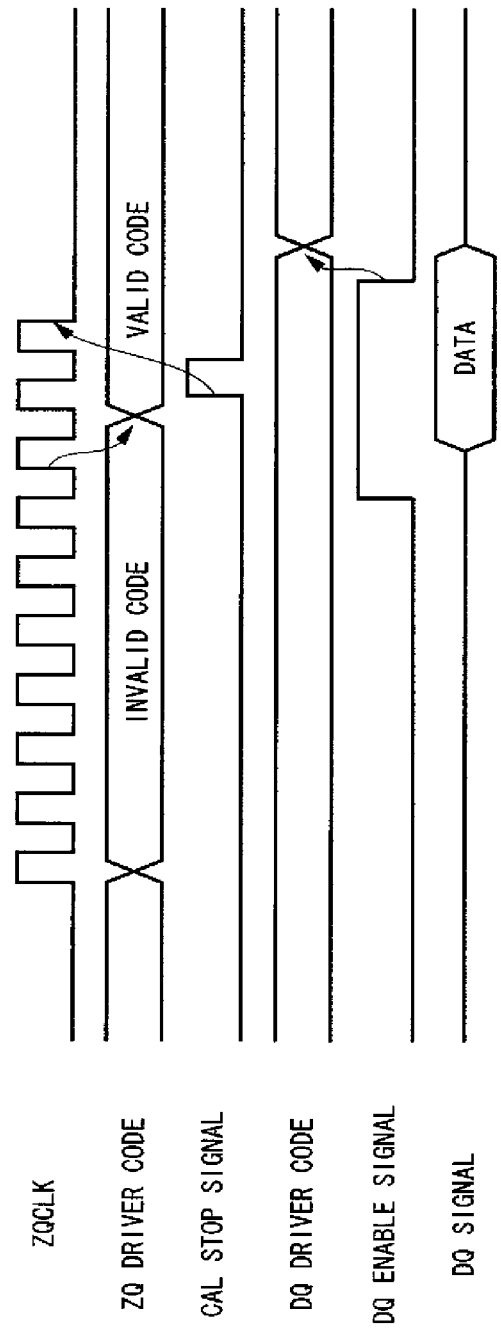
FIG. 5B is a timing chart illustrating another example of waveforms of signals of the semiconductor device shown in FIG. 1.

In FIG. 5A, the changes in the logic levels of the ZQ command and the ZQ Enable signal are not shown.

In the ZQ calibration circuit 3, the ZQ control circuit 31 starts counting the number of counts of the ZQCLK with the internal counter circuit 38. The ZQ control circuit 31 activates the Vref generator 33 and the ZQ level comparator 34 in response to a change in the logic level of the ZQ Enable signal. At the same time, the ZQ control circuit 31 sets the logic level of the PU Driver Enable to 0 and turns on the P-channel MOS transistor 116 of the PU replica 35.

The driver code generation circuit 32 changes the ZQPU driver code, namely the logic levels of the five signals input to the gate terminals of the P-channel MOS transistors 111 to 115, specifically the logic levels of 5-bit data, whenever the ZQCLK is input thereto.

The ZQ level comparator 34 determines the logic level of the PU Hit signal based on a comparison between the potential of the ZQ pad and the potential (0.5×VDDQ) of the reference voltage Vref. When both potentials are equal to each other, the 5-bit data become the data of the DQPU driver code.

The ZQ level comparator 34 changes the ZQPD driver code, namely the logic levels of the five signals input to the gate terminals of the N-channel MOS transistors 131 to 135, specifically the logic levels of 5-bit data, whenever the ZQCLK is input thereto.

The ZQ level comparator 34 determines the logic level of the PD Hit signal based on a comparison between the potential of the PD calibration node and the potential (0.5×VDDQ) of the reference voltage Vref. When both potentials are equal to each other, the 5-bit data become the data of the DQPD driver code. Since the on-resistance of the PU replica 35 is very close to the on-resistance of the PU replica 36, when both potentials are equal to each other, the on-resistance of the PD replica 37 becomes very close to the resistance of the external resistor element ER.

During the above-described impedance adjustment, namely in the "INVALID CODE" period of the ZQ driver code, the control circuit 1 changes the logic level of the DQ Enable signal from 0 to 1 in response to an input of a READ command, for example. The DQ circuit 4 outputs the data stored in the memory cell to the outside of the semiconductor device 100 as a DQ signal.

When the driver code generation circuit 32 has a configuration shown in FIG. 4A, the code update circuit 41 supplies the ZQ driver code, which is the result of the impedance adjustment of the replica circuit, to the latch circuit 42 as the DQ driver code a1 when both the PU Hit and PD Hit signals are input thereto. The latch circuit 42 latches the DQ driver code a1. The latch circuit 42 supplies the DQ driver code a2 to the latch circuit 43 when the logic level of the CAL Stop signal becomes 1. The latch circuit 43 latches the DQ driver code a2.

Although in FIG. 5B, the driver code generation circuit 32 supplies the CAL Stop signal every eight counts of the ZQCLK, the invention is not limited to this number. As described above, however, the CAL Stop signal is generated when the impedance adjustment of the replica circuit ends and the logic levels of both the PU Hit and PD Hit signals become 1.

In the command latch circuit 2A, the logic level of the /R input of the NAND circuit 24 is changed from 1 to 0 when the logic level of the CAL Stop signal changes to 1, and the NAND circuit 24 changes the logic level of an output signal thereof to 1. On the other hand, since the logic level of the ZQ command is 0, the logic level of the IS input which is the other input of the NAND circuit 23 is 1.

Therefore, since the logic levels of the two input signals input to the NAND circuit 23 are all 1, the logic level of the ZQ Enable signal is changed from 1 to 0.

The OSC circuit 25 stops oscillating and stops outputting the ZQCLK when the logic level of the ZQ Enable signal changes to 0.

On the other hand, in the driver code generation circuit 32, through the whole of a period of time when the logic level of the DQ Enable signal is 1, the latch circuit 43 does not output the DQ driver code but latches it.

When the DQ circuit 4 maintains the logic level of the DQ signal for a predetermined period of time, the control circuit 1 changes the logic level of the DQ Enable signal from 1 to 0. In this way, the latch circuit 43 outputs the DQ driver code a2 being latched to the DQ circuit 4 as the DQ driver code, whereby the size of the driver forming the output buffer of the DQ circuit 4 is updated. During this update, the output of the output buffer is in a high impedance state.

As described above, the semiconductor device (semiconductor device 100) according to this embodiment includes an impedance adjustment circuit (ZQ calibration circuit 3) that generates a driver code (DQ driver code) performing an impedance adjustment on an output buffer forming an input/output circuit (DQ circuit 4). The impedance adjustment circuit (ZQ calibration circuit 3) supplies the driver code to the input/output circuit (DQ circuit 4). The semiconductor device (semiconductor device 100) according to this embodiment prohibits the impedance adjustment of the output buffer through the whole of a period of time when the input/output circuit (DQ circuit 4) is activated in response to an input of an external read or write command.

With this configuration, the control circuit 1 generates a signal (DQ Enable signal) representing an activation of the output buffer. The signal (DQ Enable signal) is transitioned from a first logic level to a second logic level in response to the input of the external read or write command. The signal (DQ Enable signal) is transitioned from the second logic level to the first logic level in response to the completion of a read or write operation. The driver code generation circuit 32 of the ZQ calibration circuit 3 latches the driver code (DQ driver code) to the output buffer through the whole of a period of time when the logic level of the signal (DQ Enable signal) representing activation of the output buffer is in the first logic level. The driver code generation circuit 32 supplies the driver code to the DQ circuit 4 so as to change the buffer size of the output buffer when the logic level of the DQ Enable signal is changed to the second logic level.

When the driver code is not latched, as shown in FIG. 5A, the driver code generation circuit 32 supplies the driver code to the DQ circuit 4 in synchronism with a change of the logic level of the CAL Stop signal to the second logic level so that the buffer size of the output buffer is updated, resulting in generation of noise in the DQ signal.

The driver code generation circuit 32 latches the driver code to the output buffer to supply the driver code to the DQ circuit 4 when the logic level of the DQ Enable signal is transitioned to the second logic level. Even when the READ command or the WRITE command is input through the whole of a period of time the impedance adjustment, no noise is generated in the DQ signal which is input and output to/from the DQ circuit 4.

Even when a special impedance adjustment period using the ZQ terminal is not provided, the impedance adjustment may be performed in the background of other operations such as a refresh operation. Even when the semiconductor device transitions from a refresh operation to a read operation and the output buffer is activated, an update of the driver code of the output buffer is inhibited, and it is thus possible to prevent generation of noise in the DQ signal.

Although it has been described for the case where the CAL Stop signal is input to the command latch circuit 2A, the same advantage can be obtained when the ZQ End signal is input to the command latch circuit 2A. When the ZQ End signal is input to the command latch circuit 2A, the impedance adjustment ends when the counter circuit 38 has counted a predetermined number of counts of the ZQCLK.

Figure 6:
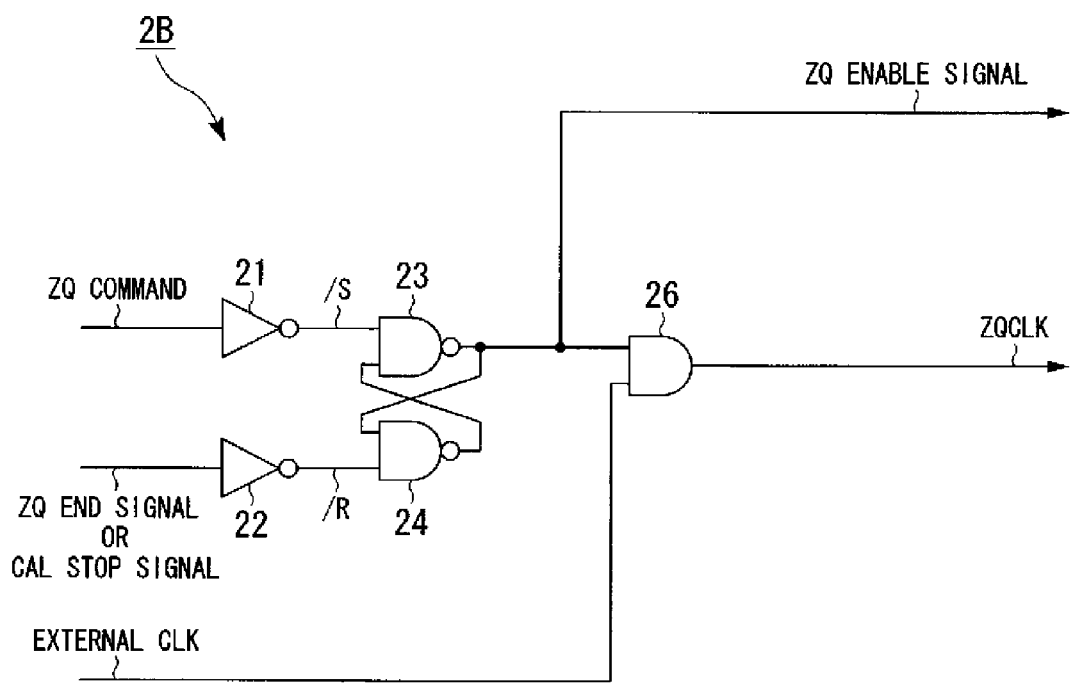
FIG. 6 is a circuit diagram illustrating a driver code generating circuit in a semiconductor device in a second embodiment of the present invention.

The command latch circuit 2A in the first embodiment described above may be replaced with a command latch circuit 2B shown in FIG. 6. The command latch circuit 2B will be described.

In FIG. 6, the same portions as those in FIG. 2 will be denoted by the same reference numerals, and description of the same portions will be omitted appropriately.

The command latch circuit 2B includes the inverter circuits 21 and 22, the NAND circuits 23 and 24, and an AND circuit 26.

The command latch circuit 2B is the same as that of the first embodiment described above, in that it outputs the ZQ Enable signal upon receiving the ZQ command and stops outputting the ZQ Enable signal upon receiving the ZQ End signal or the CAL stop signal.

The AND circuit 26 is a logical AND circuit which receives the ZQ Enable signal and an external CLK and is a circuit which outputs the ZQCLK to the ZQ calibration circuit 3.

The AND circuit 26 changes the logic level of the ZQCLK between 0 to 1 in response to a change in the logic level of the external CLK between 0 to 1 through the whole of a period of time when the logic level of the ZQ Enable signal is 1.

The command latch circuit 2B generates and supplies the ZQCLK at the same cycle as the external CLK to the ZQ calibration circuit 3. Although the external CLK is not shown in FIG. 5A, the external CLK is a signal which is input to a terminal of the semiconductor device 100, for example, a CLK terminal of a DRAM.

As described above in the first embodiment, the ZQ calibration circuit 3 is a circuit that performs an impedance adjustment (ZQ calibration) between an external resistor element connected to a ZQ terminal and an internal replica buffer in synchronism with the input ZQCLK upon receiving the ZQ Enable signal.

The driver code generation circuit 32 outputs the 5-bit ZQPU driver code to the PU replica 35 during one cycle of the ZQCLK. The driver code generation circuit 32 repeats this output operation while changing the 5-bit data until the PU Hit signal is input from the ZQ level comparator 34.

Subsequently, the driver code generation circuit 32 outputs the 5-bit ZQPD driver code to the PD replica 37. The driver code generation circuit 32 repeats this output operation while changing the 5-bit data until the PD Hit signal is input from the ZQ level comparator 34.

The driver code generation circuit 32 outputs the CAL Stop signal representing the end of ZQ calibration upon receiving both the PU Hit and PD Hit signals. The driver code generation circuit 32 outputs the driver code which is the result of DQ adjustment, namely the DQPU driver code and the DQPD driver code, to the DQ circuit 4 when the logic level of the DQ Enable signal is changed to 0.

In the command latch circuit 2B, the logic level of the /R input of the NAND circuit 24 is transitioned from 1 to 0 when the logic level of the CAL Stop signal changes to 1, and the NAND circuit 24 changes the logic level of an output signal thereof to 1. On the other hand, since the logic level of the ZQ command is 0, the logic level of the /S input which is the other input of the NAND circuit 23 is 1.

Therefore, since the logic levels of the two input signals input to the NAND circuit 23 are all 1, the logic level of the ZQ Enable signal is transitioned from 1 to 0.

The AND circuit 26 stops outputting the ZQCLK when the logic level of the ZQ Enable signal changes to 0.

Although it has been described for the case where the CAL Stop signal is input to the command latch circuit 2B, the logic level of the ZQ Enable signal is maintained at 1 until the calibration ends even when the ZQ End signal is input to the command latch circuit 2B.

In either case, since the time for each adjustment is synchronized to the external CLK, the calibration period varies when the cycle of the external CLK is changed.

SECOND EMBODIMENT

A second embodiment of the invention will be described.

In this embodiment, a case where the driver code generation circuit 32 has a configuration shown in the block diagram of FIG. 4B will be described.

In FIG. 4B, the driver code generation circuit 32 includes a code update circuit 46, a latch circuit 47, an inverter circuit 48, a NAND circuit 49, and an inverter circuit 50.

The code update circuit 46 may have the same configuration as the code update circuit 41 described above. The code update circuit 46 is configured to output the ZQ driver code which is 10-bit data, i.e., the sum of the ZQPU driver code and the ZQPD driver code, to the replica circuit of the ZQ calibration circuit 3. The code update circuit 46 supplies the DQ driver code b1 to the latch circuit 47 upon receiving both the PU Hit and PD Hit signals.

The inverter circuit 48 is a NOT circuit which inverts the logic level of the DQ Enable signal. The NAND circuit 49 is a NOT circuit with three inputs and outputs a signal with logic level 0 to the inverter circuit 50 when the logic levels of the PU Hit and the PD Hit are all 1 and the logic level of the DQ Enable signal becomes 0.

The inverter circuit 50 is a NOT circuit which inverts the logic level of an output of the NAND circuit 49. The inverter circuit 48, the NAND circuit 49, and the inverter circuit 50 cooperate with each other to output the CAL Stop signal with logic level 1 to the command latch circuit 2A and the latch circuit 47 upon receiving both the PU Hit and the PD Hit signals from the ZQ level comparator 34 and when the logic level of the DQ Enable signal becomes 0.

The latch circuit 47 is a circuit which latches the DQ driver code b1. The latch circuit 47 latches the DQ driver code b1 through the whole of a period of time when the logic level of the DQ Enable signal is 1. The latch circuit 47 supplies the DQ driver code to the DQ circuit 4 when the logic level of the DQ Enable signal becomes 0.

The DQ driver code and the DQ driver code b1 have the same logic level as that of the ZQ driver code and are 10-bit data which reflect the result of the impedance adjustment of the replica circuit of the ZQ calibration circuit 3.

In this configuration, the time at which the CAL Stop signal is generated is later than the time at which the logic level of the DQ Enable signal becomes 0. In the driver code generation circuit 32 shown in FIG. 4A, the CAL Stop signal is generated prior to the time when the logic level of the DQ Enable signal becomes 0. In the driver code generation circuit 32 shown in FIG. 4B, the latch circuit 47 outputs the DQ driver code to the DQ circuit 4 in response to a change of the logic level of the DQ Enable signal to 0.

As described above, the semiconductor device (semiconductor device 100) according to this embodiment includes an impedance adjustment circuit (ZQ calibration circuit 3) that generates a driver code (DQ driver code) performing an impedance adjustment on an output buffer forming an input/output circuit (DQ circuit 4). The impedance adjustment circuit (ZQ calibration circuit 3) supplies the driver code to the input/output circuit (DQ circuit 4). The semiconductor device (semiconductor device 100) according to this embodiment discontinues the impedance adjustment of the output buffer through the whole of a period of time when the input/output circuit (DQ circuit 4) is activated in response to an input of an external read or write command.

The semiconductor device operates such that upon supplying the driver code (DQ driver code) to the input/output circuit (DQ circuit 4), the impedance adjustment circuit (ZQ calibration circuit 3) holds the driver code (DQ driver code) while the input/output circuit (DQ circuit 4) is in an active state. The impedance adjustment circuit (ZQ calibration circuit 3) supplies the driver code (DQ driver code) to the input/output circuit (DQ circuit 4) when the input/output circuit (DQ circuit 4) is transitioned to an inactive state.

In accordance with the semiconductor device, the impedance adjustment circuit (ZQ calibration circuit 3) includes a control circuit (ZQ control circuit 31) that initiates an impedance adjustment in response to a transition in the logic level of an impedance adjustment start and end signal (ZQ Enable signal). The impedance adjustment start and end signal (ZQ Enable signal) is supplied from a signal generation circuit (command latch circuit 2A). The transition in the logic level of an impedance adjustment start and end signal (ZQ Enable signal) is a transition from a first logic level to a second logic level. The impedance adjustment circuit (ZQ calibration circuit 3) also includes a driver code generation circuit (driver code generation circuit 32) that generates a driver code (DQ driver code) of the output buffer in response to a clock (ZQCLK) output from the signal generation circuit (command latch circuit 2A). The impedance adjustment circuit (ZQ calibration circuit 3) also includes a replica buffer (PU replicas 35 and 36 and PD replica 37) that includes a group of transistors which are the same as a plurality of transistors forming the output buffer. The driver code generation circuit (driver code generation circuit 32) changes an impedance of the replica buffer (PU replicas 35 and 36 and PD replica 37). The driver code generation circuit (driver code generation circuit 32) generates the driver code (DQ driver code) based on ON/OFF states of the group of transistors included in the replica buffer (PU replicas 35 and 36 and PD replica 37). The driver code generation circuit (driver code generation circuit 32) generates the driver code (DQ driver code) when the impedance of the replica buffer becomes closer to a predetermined impedance. The driver code generation circuit (driver code generation circuit 32) generates a driver code generation end signal (CAL Stop signal) and supplies the driver code (DQ driver code) to the output buffer when the input/output circuit (DQ circuit 4) is transitioned into the inactive state.

The semiconductor device includes the control circuit (ZQ control circuit 31) that generates a driver code generation end signal (ZQ End signal) when an internal counter (counter circuit 38) has counted a preset number of counts of a clock.

The semiconductor device includes the signal generation circuit (command latch circuit 2A) which generates an impedance adjustment start and end signal (ZQ Enable signal) representing the start and end of the impedance adjustment of the impedance adjustment circuit (ZQ calibration circuit 3). The signal generation circuit (command latch circuit 2A) is configured to transition the logic level of the impedance adjustment start and end signal (ZQ Enable signal) from a first logic level to a second logic level in response to an external calibration command. The signal generation circuit (command latch circuit 2A) is configured to transition the logic level of the impedance adjustment start and end signal (ZQ Enable signal) from the second logic level to the first logic level in response to a driver code generation end signal (CAL Stop signal) which has been output from the impedance adjustment circuit (ZQ calibration circuit 3).

The semiconductor device includes the signal generation circuit (command latch circuit 2A) that includes an oscillator circuit (OSC circuit 25). The oscillator circuit (OSC circuit 25) initiates oscillating and outputs a clock (ZQCLK) in response to a transition in the logic level of the impedance adjustment start and end signal (ZQ Enable signal) from the first logic level to the second logic level.

The above configuration of the driver code generation circuit 32 allows decreasing the number of latch circuits to which the DQ Enable signal The decrease by one for one bit of the driver code can be available. The above configuration of the driver code generation circuit 32 can decrease as a whole the number of latch circuits by the same number as the number of bits of the DQ driver code. Therefore, it is possible to obtain the advantage that the chip size can be reduced further while maintaining the advantages of the first embodiment described above.

Although it has been described for the case where the CAL Stop signal is input to the command latch circuit 2A, similarly to the first embodiment, the signal input to the command latch circuit 2A may be the ZQ End signal. The command latch circuit 2A may have the configuration of the command latch circuit 2B.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A device, comprising:
a first circuit;
an adjustment circuit performing an adjustment on a first impedance of the first circuit, the adjustment circuit discontinuing the adjustment on the first impedance while the first circuit is in an activated state;
an impedance-adjustment control signal generating circuit that generates an impedance-adjustment control signal that inhibits the adjustment circuit from performing the adjustment on the first impedance,
wherein the adjustment circuit comprises:
a control circuit that initiates the adjustment on the first impedance in response to the impedance-adjustment control signal;
a driver code generating circuit that generates a driver code: and
a replica circuit that replicates the first circuit,
wherein the driver code generating circuit that changes a second impedance of the replica circuit to have the second impedance close to a predetermined impedance value,
the driver code generating circuit that generates the driver code, based on a configuration of the replica circuit, when the second impedance comes close to the predetermined impedance value,
the driver code generating circuit that supplies the driver code to the first circuit after the first circuit is transitioned to a deactivated state from the activated state,
wherein the impedance-adjustment control signal generating circuit transitions the impedance-adjustment control signal from a first logic level to a second logic level in response to a calibration command, and
the impedance-adjustment control signal generating circuit transitions the impedance-adjustment control signal from the second logic level to the first logic level in response to a driver code generation terminating signal that is generated by the driver code generating circuit.

2. The device according to claim 1, wherein the impedance-adjustment control signal generating circuit comprises an oscillator circuit that generates a first clock in response to a transition of the impedance-adjustment control signal from the first logic level to the second logic level, and the driver code generating circuit generates the driver code in synchronism with the first clock signal.

3. The device according to claim 1, wherein the impedance-adjustment control signal generating circuit generates a first clock, in response to an external signal which is cyclically input, after the impedance-adjustment control signal is transitioned from the first logic level to the second logic level, the driver code generating circuit generates the driver code in synchronism with the first clock signal.

4. The device according to claim 1, further comprising a control circuit inhibiting the adjustment circuit from performing the adjustment on the first impedance, in response to an input of a command signal which is to activate the first circuit.

5. The device according to claim 1, wherein the adjustment circuit generates a driver code for the adjustment on the first impedance, the adjustment circuit supplies the driver code to the first circuit.

6. The device according to claim 5, wherein the adjustment circuit holds the driver code while the fast circuit is in the activated state, the adjustment circuit supplies the driver code to the first circuit after the first circuit is transitioned to a deactivated state from the activated state.

7. The device according to claim 1, wherein the adjustment circuit discontinues the adjustment on the first impedance while the first circuit is activated in accordance with at least one of a read command and a write command.

8. The device according to claim 1, wherein the driver code generating circuit generates a driver code generation terminating signal when the second impedance comes close to the predetermined impedance value.

9. The device according to claim 1, wherein the driver code generating circuit generates a driver code generation terminating signal after the first circuit is transitioned to a deactivated state from the activated state.

10. The device according to claim 1, wherein the impedance-adjustment control signal generating circuit generates a first clock signal, the driver code generating circuit generates the driver code in synchronism with the first clock signal.

11. The device according to claim 10, wherein the control circuit comprises a counter that counts up the first clock signal, the control circuit generates the driver code generation terminating signal when the number counted by the counter reaches a predetermined number.

12. The device according to claim 1, wherein the first circuit comprises a first plurality of transistors, the replica circuit comprises a second plurality of transistors which is identical to the first plurality of transistors, and the driver code generating circuit generates the driver code based on ON-OFF states of the second plurality of transistors.

13. A device, comprising:
a first circuit;
a calibration circuit starting an operation to calibrate an impedance of the first circuit in response to an activation of a first signal and ending the operation in response to a deactivation of the first signal, the impedance of the first circuit being calibrated from a first impedance to a second impedance in response to the deactivation of the first signal;
an operation circuit controlling the first circuit such that when the first circuit is required to output a data signal during the activation of the first signal, the first circuit outputs the data signal with the first impedance, and that when the first circuit is required to output a data signal after a change from the activation to the deactivation of the first signal, the first circuit outputs the data signal with the second impedance.

14. The device according to claim 13, wherein the first signal is a signal designated by a calibration command.

15. The device according to claim 14, wherein the output of the data of the first circuit is controlled, in response to a read command, by the operation circuit.

16. The device according to claim 15, wherein the device receives the read command from external, after the device has received the calibration command from external.

17. A method, comprising:
starting an operation to calibrate an impedance of a data terminal of a device in response to an activation of a first signal;
ending the operation in response to an deactivation of the first signal, the impedance of the data terminal being calibrated from a first impedance to a second impedance in response to the deactivation of the first signal;
outputting a data signal with the first impedance from the data terminal of the device when the device is required to output the data signal during the activation of the first signal; and
outputting a data signal with the second impedance from the data terminal of the device when the device is required to output the data signal after a change from the activation to the deactivation of the first signal.

18. The method according to claim 17, further comprising supplying a calibration command and then a read command to the device, the calibration command being a command that requires the device to calibrate the impedance of the data terminal, and the read command being a command that requires the device to output the data signal at the data terminal.

19. The method according to claim 18, wherein the deactivation of the first signal is designated in response to the read command.

20. The method according to claim 17, further comprising generating the first signal in response to a calibration command.

* * * * *